United States Patent
Brunner et al.

(10) Patent No.: US 10,591,513 B2
(45) Date of Patent: Mar. 17, 2020

(54) COIL ARRANGEMENT, AND ELECTROCHEMICAL SWITCH, RESPECTIVELY MEASUREMENT TRANSMITTER, FORMED THEREWITH

(71) Applicant: Endress + Hauser Flowtec AG, Reinach (CH)

(72) Inventors: Adrian Brunner, Muttenz (CH); Matthias Brudermann, Moehlin (CH); Christoph Werle, Liestal (CH)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 201 days.

(21) Appl. No.: 15/315,034

(22) PCT Filed: May 27, 2015

(86) PCT No.: PCT/EP2015/061656
§ 371 (c)(1),
(2) Date: Nov. 30, 2016

(87) PCT Pub. No.: WO2015/189027
PCT Pub. Date: Dec. 17, 2015

(65) Prior Publication Data
US 2017/0199231 A1      Jul. 13, 2017

(30) Foreign Application Priority Data

Jun. 10, 2014   (DE) .................. 10 2014 108 107

(51) Int. Cl.
*G01R 15/18*   (2006.01)
*H01H 47/32*   (2006.01)
(Continued)

(52) U.S. Cl.
CPC .......... *G01R 15/183* (2013.01); *H01H 47/32* (2013.01); *H01H 50/18* (2013.01); *H01H 50/44* (2013.01)

(58) Field of Classification Search
None
See application file for complete search history.

(56) References Cited

U.S. PATENT DOCUMENTS

| 4,970,622 A | 11/1990 | Buchl |
| 5,668,693 A * | 9/1997 | Tennies ................ H01H 47/002 361/153 |

(Continued)

FOREIGN PATENT DOCUMENTS

| CN | 101689442 A | 3/2010 |
| DE | 69612975 T2 | 11/2001 |

(Continued)

OTHER PUBLICATIONS

German Search Report, German Patent Office, Munich, DE, dated Feb. 16, 2015.
(Continued)

*Primary Examiner* — Nasima Monsur
(74) *Attorney, Agent, or Firm* — Bacon & Thomas, PLLC

(57) ABSTRACT

A coil arrangement has an electrical coil and an armature movable between a first and second end positions, an electronic switch switchable between at least two switch states, a control and monitoring circuit for producing a switching signal actuating the electronic switch and an operating circuit for providing an operating voltage and an electrical current measurement signal representing an electrical current flowing as a function of time in a coil electrical current circuit formed with the coil. The control and monitoring circuit is adapted to detect whether an inductance of the coil has a dependence on the switching signal as a function of time. The electromechanical has a first switch (Continued)

contact movable between first and second switch positions, a second switch contact and a coil arrangement of the invention, while the measurement transmitter has also a measuring circuit for receiving at least one transducer signal.

46 Claims, 4 Drawing Sheets

(51) Int. Cl.
*H01H 50/18* (2006.01)
*H01H 50/44* (2006.01)

(56) References Cited

U.S. PATENT DOCUMENTS

| | | |
|---|---|---|
| 5,784,245 A | 7/1998 | Moraghan |
| 6,023,110 A | 2/2000 | Henrion |
| 2002/0167777 A1* | 11/2002 | Parisi .................. H01H 47/325 361/154 |
| 2011/0228438 A1 | 9/2011 | Kohri |
| 2012/0179423 A1 | 7/2012 | Robl |

FOREIGN PATENT DOCUMENTS

| | | |
|---|---|---|
| DE | 102009029495 A1 | 3/2011 |
| DE | 102010011394 A1 | 9/2011 |
| DE | 102014108107 A1 | 12/2015 |
| WO | 9824106 A1 | 6/1998 |
| WO | 2008064694 A1 | 6/2008 |
| WO | 2015189027 A1 | 12/2015 |

OTHER PUBLICATIONS

International Search Report, EPO, The Netherlands, dated Aug. 21, 2015.
English Translation of the International Preliminary Report on Patentability, WIPO, Geneva, CH, dated Dec. 22, 2016.

* cited by examiner

COIL ARRANGEMENT, AND ELECTROCHEMICAL SWITCH, RESPECTIVELY MEASUREMENT TRANSMITTER, FORMED THEREWITH

TECHNICAL FIELD

The invention relates to a coil arrangement formed by means of an electrical coil and an armature movable between two end positions. Furthermore, the invention relates to a electromechanical switch and a measurement transmitter formed by means of such a coil arrangement, respectively a measuring device with such an electromechanical switch.

BACKGROUND DISCUSSION

Applied in industrial measuring- and automation technology, especially also in connection with the automation of chemical processes or procedures for producing a product from a raw or starting material by use of chemical, physical or biological processes and/or the automated control of industrial plants, directly installed at the respective plant, at times, also referred to as field devices, are measuring devices, such as e.g. Coriolis mass flow measuring devices, and density measuring devices, magneto inductive flow measuring devices, vortex flow measuring devices, ultrasound flow measuring devices, thermal mass flow measuring devices, pressure measuring devices, fill level measuring devices, temperature measuring devices, pH measuring devices, etc., which serve for ascertaining measured values representing a time variable, physical and/or chemical measured variable as well as producing, in each case, at least one digital or analog measured value signal for transmitting the measured values externally of the respective measuring device. The measured variable to be registered by means of the respective measuring device can, depending on application, be, for example, a mass flow, a density, a viscosity, a fill level- or a limit level, a pressure, a pH value, an electrical conductivity or a temperature or the like, of a liquid, powdered-, vaporous- or gaseous medium, which is conveyed, respectively held, in a corresponding container, such as e.g. a pipeline or a tank. Such measuring devices, known, per se, to those skilled in the art, are disclosed in, among others, European patent, EPA 1 591 977, British patent, GB A 2,229,897, USA 2001/0016802, USA 2010/0026322, USA 2011/0062942, U.S. Pat. Nos. 5,672,975 A, 6,014,100 A, 6,140,940 A, 6,452,493 B, 6,472,884 B, 6,684,340 B, 7,162,651 B, 7,296,482 B, 7,630,844 B, US 7,778,784 B, 7,792,646 B, Published International Application, WO A 00/26739, WO A 00/48157, WO A 01/71291, WO A 03/106931, WO A 2008/091548, WO A 2009/002341, WO A 2011/005938, WO A 2012/009003, WO A 2012/159683, WO A 2012/163608, the WO A 88/02476, WO A 88/02853, WO A 94/20940, WO A 95/08123, WO A 95/08758 or also the not pre-published international application PCT/EP2013/074632 of the applicant, respectively are sold industrially by Endress+Hauser Group of Companies, for example, under the designations, t trend ATT12, Flowphant T DTT31, Promag 53H, Prowirl 73F, Promass E 200, Promass F 200, Promass 83X, or Promass 84F.

Measuring devices of the above indicated type are typically formed by associating a physical-electrical or chemical-electrical measuring transducer serving for registering the respective process variable with a measurement transmitter electrically coupled therewith. Said measuring transducer is most often embodied to be applied in a wall of the container containing the medium or in the course of a line, for example, a pipeline, conveying the medium, and to generate at least one, firstly, analog, electrical transducer signal corresponding with the measured variable to be registered, namely representing its value as a function of time. The electrical transducer signal can, in turn, be further processed by means of a transmitter electronics of the respective measurement transmitter electrically connected with the measuring transducer, in such a manner that during operation of the measuring device corresponding measured values for the measured variable are ascertained by means of the transmitter electronics. The transmitter electronics of an industrial grade measuring device is most often accommodated in a comparatively robust, for instance, impact-, pressure-, explosion- and/or weather resistant, transmitter housing. Such housing can be arranged e.g. removed from the measuring transducer and connected with such only via a flexible cable; the housing can, however, also be arranged directly on the measuring transducer, respectively on a measuring transducer housing separately housing the measuring transducer.

For processing the transducer signal, especially namely for producing digital, measured values representing the particular measured variable and for transforming such measured values into at least one measured value signal transferable- and evaluatable externally of the measurement transmitter, respectively of the measuring device formed therewith, the transmitter electronics includes, furthermore, a corresponding measuring circuit. As also disclosed in, among others, the above mentioned US-A 2001/0016802, US-A 2010/0026322, US-A 2011/0062942, U.S. Pat. Nos. 7,630,844 B, 7,792,646 B, 7,778,784 B, 6,452,493 B, 6,014, 100 A, WO-A 95/08123 or WO-A 2012/009003, the measuring circuits in the case of modern measuring devices of the type being discussed are most often formed by means of a microprocessor, which is fed the transducer signal (for example, a transducer signal already digitized earlier by means of a separate analog to digital converter) via a corresponding signal input. The microprocessor is, among other things, also provided to generate, based on the (in given cases, earlier digitized) transducer signal on the signal input, a measured value sequence, namely a sequence of digital, measured values instantaneously representing the measured variable at different points in time. The measured values generated by means of the measuring circuit are provided in the form of electrical, digital or analog, measured value signals, for example, in the form of an analog signal current correspondingly modulated in the range from 4-20 mA, on circuit outputs located equally within the transmitter housing and functioning, in each case, as an interface. Moreover, usual for making measured values available are also so-called frequency outputs, namely circuit outputs coding the measured values in a pulse sequence frequency of a binary rectangular signal, or also so-called pulse outputs, namely circuit outputs signaling in the form of a pulse the reaching of an earlier selectable, quantized, quantity unit.

Measuring devices of the type being discussed can supplementally or alternatively to circuit outputs providing measured value signals also have circuit outputs—, at times, also referred to as switch- or relay output-circuit outputs, which are adapted selectively to switch in—, respectively to switch out, an electrical circuit extending partially externally of the measuring device and, at times, also referenced as a load current loop, respectively to output a signal, most often a binary signal, for instance, in the form of a status signal for reporting an operating state of the respective measuring device and/or for transmission of an error report, respectively an alarm, to a remote reporting system or in the form of a switch signal serving for signaling a reaching of a predetermined threshold value and/or for the immediate actuating of external electrical devices connected to the measuring device, for example, an additional measuring device or, however, also a valve, a pump or a motor. Such circuit outputs can be formed, for example, by means of an electronic semiconductor switching element, such as e.g. a transistor or a thyristor, respectively be embodied as a semiconductor relay (solid state relay); widely used still, however, are also circuit outputs, which are formed by means of an electromechanical relay, thus an electromechanical switch, located within the transmitter housing and electrically connected with the transmitter electronics, respectively operated thereby.

Such electromechanical switches, respectively relays, installed in circuit outputs of measurement transmitters comprise, in each case, a coil arrangement formed by means of at least one electrical coil and a first switch contact movable therewith, consequently mechanically actuated between a first end position and a second end position, and a second switch contact. Said first switch contact, for the purpose of implementing two different switch positions, is adapted to be spaced in the first switch position from the second switch contact to form a high-resistance, respectively electrically insulating, air path, and in the second switch position to contact the second switch contact to form a low-ohm, respectively electrically conductive, connection. The coil of the coil arrangement includes a coil core and an electrical current conductor surrounding the coil core. Furthermore, a magnetic circuit is formed by means of the coil core as well as an armature of the coil arrangement, for example, a permanently magnetic armature and/or a metal armature, movable between a first end position and a second end position, wherein the coil is provided to lead an electrical current in the electrical current conductor and to convert the electrical current into a magnetic force acting between the coil core and the armature for moving the armature, and wherein the armature is provided, in the case of moving from its first end position into its second end position, to move the first switch contact from its first switch position into its second switch position, consequently to actuate the electromechanical switch.

Coil arrangements of the above indicated type, especially coil arrangements namely embodied as a component of a circuit output of a measurement transmitter, comprise, furthermore, an electrically controlled, electronic switch, for example, an electronic switch formed by means of at least one electronic, semiconductor element, such as, for instance, a transistor, switchable between at least two switch states as well as a control circuit, for example, also in combination with the previously indicated measuring circuit, namely also formed by means of its, in given cases, present microprocessor, for producing a switching signal with a variable signal level actuating the electronic switch, in such a manner that the switching signal has at times a first signal level value ("H") causing a first switch state of the electronic switch, respectively the switching signal has at times a second signal level value ("L") different from the first signal level value and causing a second switch state of the electronic switch. The electronic switch is, in turn, provided, in its first switch state, to close a coil electrical current circuit formed therewith and by the coil, in such a manner that an electrical resistance of the electrical current circuit opposing an electrical current then flowing in operation in the coil electrical current circuit then has a low-ohm, first resistance value, and in its second switch state to open the coil electrical current circuit, in such a manner that its electrical resistance then has a high-ohm, second resistance value, which is greater than the first resistance value. The measuring circuit is, furthermore, provided to generate a control signal instructing the control circuit, namely causing a change of the signal level of the switching signal from the first signal level to the second signal level or a change of the signal level of the switching signal from the second signal level to the first signal level, for example, also with application of the transducer signal and/or as a function of at least one of the measured values.

Advantages of such a circuit output formed by means of an electromechanical relay, respectively switch, include besides the relatively cost effective construction, among other things, that, structurally related, there can be implemented, on the one hand, a galvanic isolation, along with a high isolating resistance, respectively a high dielectric strength, of the so formed isolating distance between the control circuit, respectively the transmitter electronics (control current loop) formed therewith, and the electrical circuit (load current loop) extending externally of the measuring device and switched by means of the two switch contacts, and, on the other hand, a switch with very high-ohm contact junction resistance in the opened, first switch position, respectively very low-ohm contact junction resistance in the closed, second switch position, consequently with good distinguishability of the two switch states. Moreover, by means of an electromechanical relay in the load current loop, an electrical power very high in comparison to the electrical power converted in the control circuit, consequently in the control current loop, can be switched, respectively a circuit output with high overloadability and/or high short-circuit strength can be provided. Electromechanical relays, respectively circuit outputs formed therewith, exhibit regularly a high electromagnetic compatibility (EMC) and high disturbance resistance, even against electrostatic discharge (ESD).

A disadvantage of an electromechanical relay, respectively a switch formed therewith, is that its movable components, namely the armature and the switch contacts, even in the case of loading according to specification, wear mechanically, consequently such electromechanical switches can undergo, in comparison to semiconductor relays, a significantly smaller number of switching cycles, respectively have, in comparison to semiconductor relays, nominally a comparatively lower maximum number of switching cycles. Moreover, the, at the start, very low ohm contact junction resistance of such a switch in its closed (second) switch position can change as a function of the electrical powers switched during operation, in such a manner that the contact junction resistance increases with increasing duration of operation, respectively increasing number of switching cycles, in an undesired manner. Furthermore, shaking, respectively vibration, of the transmitter electronics negatively affects the ability of the respective electromechanical switch, respectively the circuit output formed therewith, to function.

Unfavorable constellations of such loadings regularly not detectable by the transmitter electronics or, in given cases, overloadings of electromechanical relay, respectively a circuit output formed therewith, equally not detected, also exceeding earlier specified limit values, can, in given cases, even lead to a total failure of the relay, for example, namely in such a manner that the armature of the relay—at times, or continually—, in spite of an alternation of the control signal from one signal level value to another, remains in an assumed end position, for example, as a result of a jamming or seizing of the armature and switch contact actuated therewith, because of deformation or breaking off of the armature or as a result of a welding or sticking together of the two switch contacts. As a result of this, the electrical circuit corresponding to the load current loop of the relay and extended externally of the measuring device can no longer be switched by means of the respective circuit output, respectively a signal can no longer be output via the circuit output. Particularly in safety related applications, such a total failure of the circuit output can lead to fatal consequences for the affected plant, respectively its environment, and must, consequently, be detected, respectively eliminated, as soon as possible.

SUMMARY OF THE INVENTION

Taking this into consideration, an object of the invention is so to improve coil arrangements of the above indicated type, respectively circuit outputs formed therewith, such that a self actuated monitoring of ability to function is provided, in such a manner that also by the coil arrangement itself a failure of the electromechanical switch, respectively circuit output, formed therewith can be recognized near in time; this as much as possible without application of additional, external (for example, integrated externally of the measuring device in the load current loop) test means, respectively as much as possible without having to transfer from the exterior to the coil arrangement, supplementally, information concerning a present electrical current flow or voltage curve in the load current loop.

For achieving the object, the invention resides in a coil arrangement, comprising:

an electrical coil having a coil core, for example, of a soft magnetic material and/or a ferrite, and an electrical current conductor, for example, of copper or a copper alloy, surrounding the coil core, for example, namely formed by means of a coil wire wound on the coil core and/or by means of a helical or spiral, conductive trace formed on a circuit card enclosing the coil core;

an armature movable between a first end position and a second end position, for example, a permanently magnetic armature, for example, an armature of a material and/or a metal having a relative permeability, $\mu r$, of greater than 10 ($\mu r > 10$);

an electronic switch switchable between at least two switch states, for example, an electrically controlled, electronic switch, especially one formed by means of at least one transistor;

a control- and monitoring circuit, for example, one formed by means of a microprocessor, for producing a switching signal with a variable signal level, for example, a binary and/or electrical switching signal, for actuating the electronic switch;

and an operating circuit for providing an operating voltage, for example, a unipolar, operating voltage, wherein a magnetic circuit is formed by means of the coil core and armature, in such a manner that the magnetic circuit has a magnetic resistance, $R_m$, dependent on a position of the armature, respectively that the coil has an inductance, L, dependent on the position of the armature;

wherein the coil is adapted to lead an electrical current in the electrical current conductor and to convert the electrical current into a magnetic force acting between its coil core and the armature and dependent on an electrical current level of the electrical current;

wherein the electronic switch is adapted, in a first switch state, to close a coil electrical current circuit formed by means of the operating circuit, the coil and the electronic switch, in such a manner that an electrical resistance, R, of the coil electrical current circuit opposing an electrical current then driven by the operating voltage and flowing in the coil electrical current circuit then has a first resistance value amounting, for example, to less than 100Ω (ohm), and, in a second switch state, to open the coil electrical current circuit, in such a manner that its electrical resistance has then a second resistance value amounting, for example, to greater than 10 kΩ (kiloohm), and greater than the first resistance value, for example, greater than 10-times the first resistance value;

wherein the operating circuit is adapted to provide an electrical current measurement signal representing electrical current flowing in the coil electrical current circuit as a function of time, for example, an electrical current measurement signal having a voltage proportional to the electrical current or in the form of a digital signal;

wherein the control- and monitoring circuit is adapted to provide the switching signal at times with a first signal level value ("H") causing the first switch state of the electronic switch, wherein the control- and monitoring circuit is adapted to provide the switching signal at times with a second signal level value ("L") different from the first signal level value and causing the second switch state of the electronic switch;

and wherein the control- and monitoring circuit is adapted with application of the electrical current measurement signal, for example, in digitized form, to perform a checking of the coil, namely to detect, whether the inductance, L, of the coil has a dependence on the switching signal as a function of time, respectively a behavior as a function of time corresponding to the switching signal as a function of time, and/or to detect, whether the coil reacts to a change of the signal level of the switching signal from the first signal level ("H") to the second signal level ("L") with a change of its inductance, L, for example, namely with an increasing of its inductance, L, and/or to detect, whether the coil reacts to a change of the signal level of the switching signal from the second signal level ("L") to the first signal level ("H") with a change of its inductance, L, for example, namely with a lessening of its inductance, L.

Furthermore, the invention resides in an electromechanical switch, comprising: a first switch contact movable between a first switch position and a second switch position, for example, a resilient, first switch contact, a second switch contact and, for actuating the first switch contact, such a coil arrangement, wherein its armature is adapted in the case of moving from its first end position into its second end position to move the first switch contact from its first switch position into its second switch position.

Furthermore, the invention resides in a measurement transmitter, comprising: such an electromechanical switch; and a measuring circuit, especially a measuring circuit formed by means of a microprocessor and/or supplied power from the operating circuit, for receiving at least one transducer signal, for example, electrical transducer signal, dependent on a physical or chemical measured variable and/or representing the measured variable as a function of time.

Moreover, the invention resides in a measuring device, comprising: such a measurement transmitter; and a measuring transducer electrically coupled with the measuring circuit of the measurement transmitter for registering, especially only within a predetermined measurement range, a time variable physical and/or chemical measured variable and for generating the at least one transducer signal.

In a first embodiment of the coil arrangement, it is provided that the armature position dependent, magnetic resistance, $R_m$, of the magnet circuit formed by means of the coil core and armature in the case of armature in the first end position is less than in the case of armature in the second end position.

In a second embodiment of the coil arrangement, it is provided that the armature position dependent inductance, L, of the coil in the case of armature in the first end position is greater than in the case of armature in the second end position.

In a third embodiment of the coil arrangement, it is provided that the control- and monitoring circuit is adapted, with application of the electrical current measurement signal, to detect a defect of the coil, respectively the coil arrangement, especially as a result of an armature persisting in the first end position both in the case of switching signal having the first signal level value as well as also in the case of switching signal having the second signal level value or as a result of an armature persisting in the second end position both in the case of switching signal having the first signal level value as well as also in the case of switching signal having the second signal level value.

In a fourth embodiment of the coil arrangement, it is provided that the control- and monitoring circuit is adapted to perform the checking of the coil using a digitized electrical current measurement signal, namely a digital signal representing the electrical current flowing in the coil electrical current circuit as a function of time.

In a fifth embodiment of the coil arrangement, the control- and monitoring circuit comprises a microprocessor. Developing this embodiment of the invention further, the control- and monitoring circuit is, furthermore, adapted, by means of the microprocessor, to perform the checking of the coil and/or to generate the switching signal and/or to process the electrical current measurement signal.

In a sixth embodiment of the coil arrangement, the control- and monitoring circuit comprises a volatile data memory and the control- and monitoring circuit is adapted to store the electrical current measurement signal, at least as an extract, in the data memory, in such a manner that the data memory retains at least temporarily at least one sequence of digital electrical current values, namely digital values of a digitized electrical current measurement signal. Developing this embodiment of the invention further, the control- and monitoring circuit is, furthermore, adapted so to store the electrical current measurement signal in the data memory that at least temporarily a sequence of digital electrical current values representing a switching-off event of the coil (switching-off electrical current curve), namely the electrical current flowing in the coil as a function of time after a toggling of the electronic switch from the first switch state into the second switch state, is stored in the data memory and/or that at least temporarily a sequence of digital electrical current values (switching-on electrical current curve) representing a switching-on event of the coil, namely the electrical current flowing in the coil as a function of time after a toggling of the electronic switch from the second switch state into the first switch state, is stored in the data memory.

In a seventh embodiment of the coil arrangement, it is provided that the control- and monitoring circuit is adapted based on the electrical current measurement signal, for example, also recurringly, to ascertain, for example, namely to calculate, a characteristic value for electrical current dynamics, namely a characteristic index value for a characteristic variable characterizing the electrical current flowing in the coil as a function of time, e.g. after a toggling of the electronic switch from the first switch state into the second switch state or after a toggling of the electronic switch from the second switch state into the first switch state. Developing this embodiment of the invention further, it is provided that a rate of change of the electrical current is used as a characteristic variable. Alternatively or supplementally, however, also, for example, a time span required from a starting point in time until the reaching of a predetermined electrical current value can serve as a characteristic variable.

In an eighth embodiment of the coil arrangement, the control- and monitoring circuit comprises a volatile data memory and the control- and monitoring circuit is adapted to store the electrical current measurement signal, at least as an extract, in the data memory, in such a manner that kept in the data memory at least temporarily is at least one sequence of digital electrical current values, namely digital values of a digitized electrical current measurement signal; moreover, it is provided that the control- and monitoring circuit is adapted, based on the electrical current measurement signal, to ascertain, for example, also recurringly, by applying digital electrical current values kept in the volatile data memory, a characteristic value for electrical current dynamics. Developing this embodiment of the invention further, the control- and monitoring circuit is, furthermore, adapted to ascertain the characteristic value for electrical current dynamics using a sequence of digital electrical current values (switching-off electrical current curve) at least temporarily kept in the volatile data memory and representing a switching-off event of the coil and/or using a sequence of digital electrical current values (switching-on electrical current curve) at least temporarily kept in the volatile data memory and representing a switching-on event of the coil; for example, by summing a predetermined number of digital electrical current values, beginning with a starting electrical current value representing an electrical current flowing in the coil electrical current circuit at a predetermined starting point in time and/or a starting point in time ascertained during operation, respectively by integrating a subsection of the electrical current measurement signal representing the electrical current as a function of time within a predetermined time interval. Alternatively or supplementally, the control- and monitoring circuit can, furthermore, be adapted, for checking the coil, to ascertain a deviation between the characteristic value for electrical current dynamics and a predetermined reference value, for example, namely an earlier measured reference value and/or a reference value stored in the monitoring circuit. For checking the coil, the deviation can be compared by means of the control- and monitoring circuit with a predetermined threshold value, for example, one stored earlier in the control- and monitoring circuit and/or representing an interval boundary for a defective coil value range of the characteristic variable characterizing the electrical current flowing in the coil as a function of time. The threshold value can be stored, for example, in a non-volatile data memory.

In a ninth embodiment of the coil arrangement, it is provided that the control- and monitoring circuit has a non-volatile data memory.

In a tenth embodiment of the coil arrangement, it is provided that the control- and monitoring circuit is adapted to output a result of the checking of the coil, for example, in the form of a binary or digital, status signal.

In an 11$^{th}$ embodiment of the coil arrangement, it is provided that the control- and monitoring circuit is adapted as a result of the checking of the coil, in case an exceeding of a predetermined threshold value is ascertained corresponding with a defective coil, for example, namely a threshold value stored earlier in the control and monitoring circuit and/or a threshold value representing an interval boundary for a defective coil value range of the characteristic variable characterizing the electrical current flowing in the coil as a function of time, to generate a report signaling a defective coil, especially as a result of an armature persisting in the first end position both in the case of switching signal having the first signal level value as well as also in the case of switching signal having the second signal level value or as a result of an armature persisting in the second end position both in the case of switching signal having the first signal level value as well as also in the case of switching signal having the second signal level value.

In a 12$^{th}$ embodiment of the coil arrangement, it is provided that the control- and monitoring circuit is adapted to provide a status signal, for example, a binary or digital, status signal, dependent on a result of the checking of the coil, respectively reporting such result.

In a 13$^{th}$ embodiment of the coil arrangement, it is provided that the control- and monitoring circuit has an analog to digital converter, which is adapted to receive and to digitize the electrical current measurement signal.

In a 14$^{th}$ embodiment of the coil arrangement, it is provided that the operating circuit is adapted to output the electrical current measurement signal digitally, namely in the form of a digital signal representing the electrical current flowing in the coil electrical current circuit as a function of time.

In a 15$^{th}$ embodiment of the coil arrangement, the operating circuit includes, furthermore, a measuring resistor, for example, one integrated in the coil electrical current circuit, respectively one connected electrically in series with the coil, for providing a measurement voltage proportional to the electrical current flowing in the coil electrical current circuit. Developing this embodiment of the invention further, the operating circuit includes an analog to digital converter for digitizing the measurement voltage provided by means of the measuring resistor, respectively the operating circuit is adapted to output a digitized measurement voltage as electrical current measurement signal.

In a 16$^{th}$ embodiment of the coil arrangement, the operating circuit includes, furthermore, a measuring resistor, for example, one integrated in the coil electrical current circuit, respectively one connected electrically in series with the coil, for providing a measurement voltage proportional to the electrical current flowing in the coil electrical current circuit and the operating circuit is adapted to generate the electrical current measurement signal by means of the measurement voltage and/or to output the measurement voltage as electrical current measurement signal, for example, also in digitized form.

In a further development of the coil arrangement, such additionally comprises, mechanically coupled with the armature, a return spring, which is adapted to introduce into the armature a return force counteracting the magnetic force.

In an embodiment of the switch, it is provided that the first switch contact is adapted in the first switch position to be spaced from the second switch contact, in order to form a high-ohm, respectively electrically insulating, air path, and that the first switch contact is adapted in the second switch position to contact the second switch contact, in order to form a low-ohm, respectively electrically conductive, connection. Developing this embodiment of the invention further, it is, additionally, provided that the control- and monitoring circuit is adapted, in case, as a result of checking the coil performed using the electrical current measurement signal, a defect of the coil is detected, to generate a warning report signaling a failure of the electromechanical switch, especially as a result of an armature persisting in the first end position both in the case of switching signal having the first signal level value as well as also in the case of switching signal having the second signal level value or as a result of an armature persisting in the second end position both in the case of switching signal having the first signal level value as well as also in the case of switching signal having the second signal level value.

In a first embodiment of the measurement transmitter, it is provided that the measuring circuit is adapted to generate a control signal instructing the control- and monitoring circuit, especially namely a control signal causing a change of the signal level of the switching signal from the first signal level to the second signal level or a change of the signal level of the switching signal from the second signal level to the first signal level and/or a digital, control signal. Developing this embodiment of the invention further, the measuring circuit is, furthermore, adapted to generate the control signal using the transducer signal and/or as a function of at least one of the measured values.

In a second embodiment of the measurement transmitter, it is provided that the measuring circuit is adapted to ascertain, using the transducer signal, measured values for the measured variable.

In a third embodiment of the measurement transmitter, a switch output of the measurement transmitter is formed by means of the electromechanical switch.

Developing this embodiment of the invention further, the switch output is adapted to switch an electrical circuit extending partially externally of the measurement transmitter.

In a first further development of the measurement transmitter, such additionally comprises: a transmitter housing, wherein both the measuring circuit and also the electromechanical switch are located within the transmitter housing.

In a second further development of the measurement transmitter, such additionally comprises: a display element operated by the control- and monitoring circuit, for example, a display element located within a transmitter housing of the measurement transmitter and/or serving for displaying a result of the checking of the coil. In such case, the control- and monitoring circuit can additionally be adapted to transmit to the display element a result of the checking of the coil, for example, in the form of a binary or digital, status signal, respectively the display element can be adapted to indicate visually perceivably the result of the checking of the coil.

A basic idea of the invention is to utilize a dependence, typical for coil arrangements of the type being discussed, of their magnetic resistance, respectively their inductance, on an instantaneous position of the operationally movable armature, namely actuated by means of the coil, to check an ability of the coil arrangement to function in operation, in such a manner that, in the absence of a changing of the magnetic resistance, respectively the inductance, specific for the respective coil after the switching-on, respectively switching-off, of the coil electrical current circuit formed by means of the respective coil, presence of a defective armature is inferred, consequently a defective coil, respectively a defective coil arrangement, is detected.

BRIEF DESCRIPTION OF THE DRAWINGS

The invention and other advantageous embodiments thereof will now be explained in greater detail based on examples of embodiments shown in the figures of the drawing. Equal parts are provided in all figures with equal reference characters; when perspicuity requires or it otherwise appears sensible, already displayed reference characters are omitted in subsequent figures. Other advantageous embodiments or further developments, especially also combinations, firstly, of only individually explained aspects of the invention, result, furthermore, from the figures of the drawing, and also the dependent claims per se. The figures of the drawing show as follows:

DETAILED DISCUSSION IN CONJUNCTION WITH THE DRAWINGS

Figure 1:
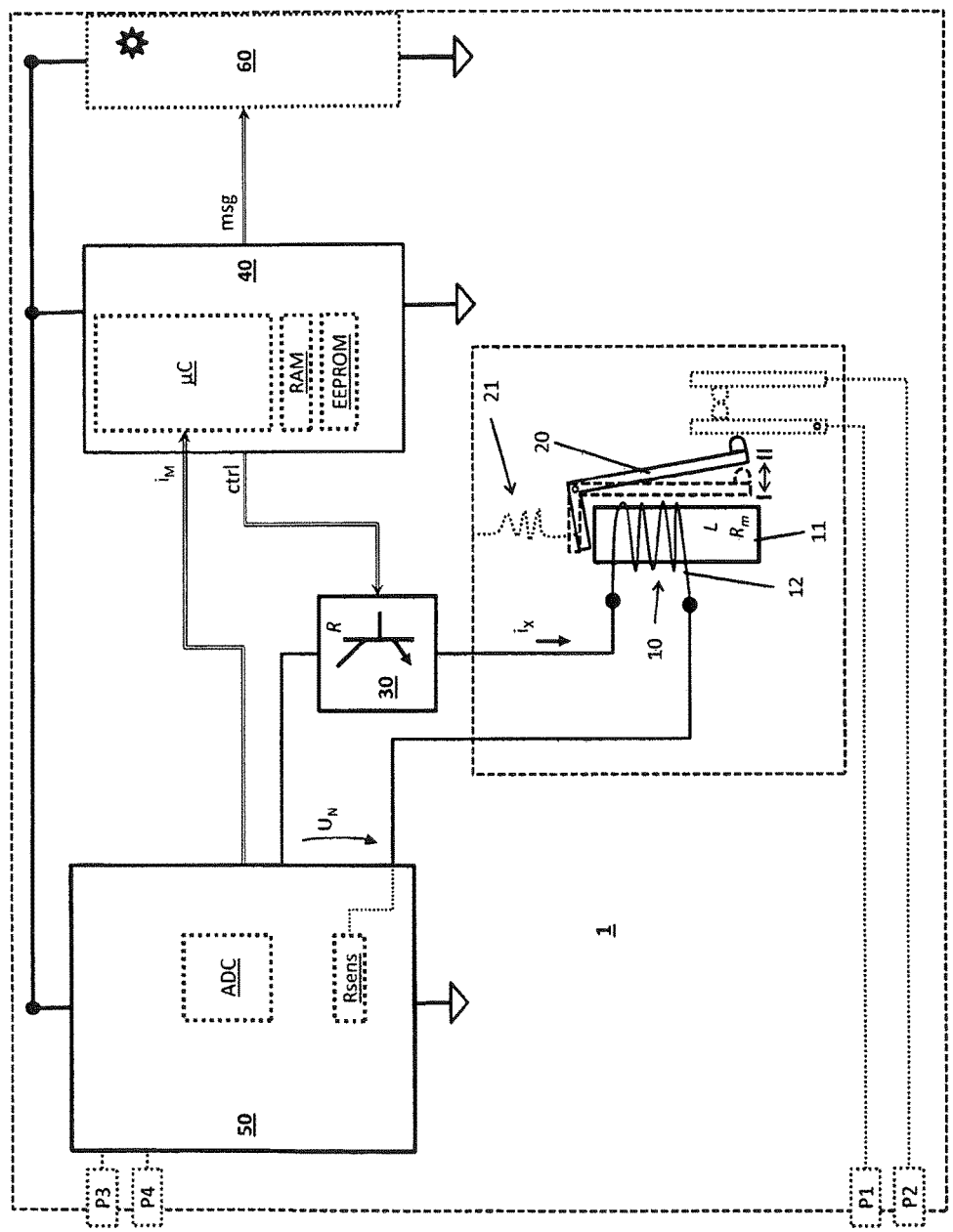
FIG. 1 is schematically, a coil arrangement, especially a coil arrangement suitable for implementing a switch- or relay output of a measuring device of industrial measuring- and automation technology.

FIG. 1 shows schematically in the manner of a block diagram an example of an embodiment of a coil arrangement, especially a coil arrangement useful for manufacturing an electromechanical switch suitable for application in a measuring device of industrial measuring- and automation technology.

The coil arrangement includes an electrical coil 10 having a coil core 11, for example, of a soft magnetic material and/or a ferrite, and an electrical current conductor 12, e.g. of copper or a copper alloy, surrounding the coil core and formed, for example, by means of a coil wire wound on the coil core and/or by means of a helical or spiral, conductive trace on a circuit card enclosing the coil core, and—neighboring the coil—an armature 20 movable between a first end position I and a second end position II, for example, a permanently magnetic and/or angular and/or pivotable armature. By means of the coil core 11 and by means of the armature 20—, for example, in the form of a pivoting armature—a magnetic circuit is formed, which has a magnetic resistance $R_m$ dependent on the position of the armature, so that the coil has an inductance L dependent on the position of the armature. The armature can be, for example, of a material and/or a metal having a relative permeability $\mu_r$ of greater than 10 ($\mu_r$>10). In the example of an embodiment shown here, the coil core and the armature are, furthermore, so embodied and positioned that the magnetic resistance $R_m$ of the magnet circuit in the case of armature 20 in the first end position I is less than in the case of armature 20 in the second end position, respectively that the inductance L of the coil 10 in the case of armature 20 in the first end position I is greater than in the case of armature 20 in the second end position.

The coil is, with interpositioning of an electronic switch 30 of the coil arrangement formed namely by means of at least one semiconductor element, for example, a transistor, electrically connected to an operating circuit 50 of the coil arrangement providing an operating voltage, for example, in the form of a direct voltage and/or unipolar voltage of less than 30 V (volt), for the purpose of forming a coil electrical current circuit and additionally adapted to lead in the electrical current conductor, at least at times, an electrical current $i_x$ and to convert the electrical current into a magnetic force acting between its coil core and the armature as a function of an electrical current level of the electrical current $i_x$. The magnetic force serves, according to an embodiment of the invention, especially to move the armature 20 into its second end position II, respectively to hold it there. In order to move the armature 20, at times, from its second end position II back into its first end position I, respectively to hold it there, the coil arrangement comprises, in an additional embodiment of the invention, mechanically coupled with the armature 20, a return spring 21, which is adapted to introduce into the armature a return force counteracting the magnetic force—here namely bringing the armature into its second end position, respectively holding it there—, in such a manner that the return spring is tensioned by bringing the armature into its second end position II, respectively relieved after a lessening of the magnetic force below a structurally related, minimum force value or a disappearing of the same, coupled with a movement of the armature back into its first end position I.

The electronic switch 30 is, in turn, switchable therefor, especially electrically controlled, between at least two switch states and, especially, adapted in a first switch state to close the coil electrical current circuit formed by means of the operating circuit, the coil and the electronic switch and in a second switch state to open the coil electrical current circuit; this, especially, in such a manner that an electrical resistance of the coil electrical current circuit opposing an electrical current $i_x$ flowing in the coil electrical current circuit as driven by the operating voltage has in the case of switch 30 in the first switch state a first resistance value amounting, for example, to less than 100Ω (ohm), and in the case of switch 30 in the second switch state a second resistance value amounting, for example, to greater than 10 kΩ (kiloohm), which, for example, is greater than the first resistance value by more than 10-times the first resistance value. The changing of the electrical resistance in the above-described manner, in turn, leads to a corresponding change of electrical current level of the electrical current $i_x$, in such a manner that—in the case of operating voltage remaining the same—the electrical current $i_x$ in the case of switch 30 in the first switch state has a higher electrical current level than in the case of switch 30 in the second switch state.

For the purpose of actuating the electronic switch 30, respectively a controlled adjusting of the electrical current level of the electrical current $i_x$ flowing in the coil, the coil arrangement includes, furthermore, a control- and monitoring circuit 40, for example, formed by means of a microprocessor, which is adapted to provide, respectively to produce, a switching signal ctrl, for example, a binary and/or electrical switching signal, having a variable signal level for actuating the electronic switch 30, in such a manner that the switching signal ctrl has at times a first signal level value ("H") causing the first switch state of the electronic switch and at times a second signal level value ("L") different from the first signal level value and causing the second switch state of the electronic switch.

In an embodiment of the invention, the control- and monitoring circuit 40 comprises a microprocessor µC. Furthermore, the control- and monitoring circuit is adapted to generate the switching signal ctrl by means of the microprocessor µC.

In order to be able to detect, as soon as possible, a possible defect of the coil 10 degrading the ability of the coil arrangement to function, respectively, associated therewith, a total failure of the coil arrangement, the control- and monitoring circuit 40 of the coil arrangement of the invention is, furthermore, provided for performing, in operation, for example, automatically and/or upon request, a checking of the coil 10, comprising evaluating the electrical current flowing in the coil electrical current circuit as a function of time. Such a defect of the coil 10 to be detected can, in given cases, for example, reside therein, respectively result therefrom, that the armature 30 is blocked and/or the return spring provided, in given cases, is broken, in such a manner that, as a result, the armature 30, both in the case of switching signal ctrl having the first signal level value as well as also in the case of switching signal ctrl having the second signal level value, remains in the first end position I, or, both in the case of switching signal ctrl having the first signal level value as well as also in the case of switching signal ctrl having the second signal level value, remains in the second end position II. Another defect can be, for example, also that the armature is broken off or even completely missing. Especially, the control- and monitoring circuit 40 is, furthermore, adapted to perform the checking of the coil 10 using a digitized electrical current measurement signal, namely a digital signal representing the electrical current flowing in the coil electrical current circuit as a function of time. Accordingly, the operating circuit 50 is, furthermore, adapted to provide an electrical current measurement signal $i_M$ representing the electrical current $i_x$ flowing in the coil electrical current circuit as a function of time, for example, with a voltage proportional to the electrical current or in the form of a digital signal, and the control- and monitoring circuit 50 is, furthermore, adapted using the, in given cases, firstly, digitized, electrical current measurement signal $i_m$ to perform a checking of the coil, for example, also by means of the, in given cases, provided microprocessor and/or in connection with an automated self-diagnosis of the coil arrangement. A defect of the coil, respectively the coil arrangement formed therewith, possibly detected by the control- and monitoring circuit can, furthermore, also be reported externally, for example, by outputting a corresponding warning report via a display element, such as e.g. a liquid crystal display (LCD) or a light-emitting diode (LED), connected to the control- and monitoring circuit 40 and/or by outputting to a signal output formed, in given cases, also as a service interface, a status signal indicating the defect.

For the purpose of generating the electrical current measurement signal $i_M$, the operating circuit 50 includes, in an additional embodiment of the invention, a measuring resistor Rsens for providing a measurement voltage proportional to the electrical current flowing in the coil electrical current circuit. In the simplest case, the measuring resistor Rsens can—, as indicated in FIG. 1—be directly integrated into the coil electrical current circuit, respectively connected electrically in series with the coil L. The measurement voltage can be output by the operating circuit—directly used or after an additional amplifier circuit—, for example, as an analog electrical current measurement signal, in given cases, also as an intermediately amplified, electrical current measurement signal.

Particularly for the above-described case, in which the control- and monitoring circuit 50 is adapted to process, respectively to evaluate, a digitized electrical current measurement signal $i_M$, the operating circuit can, furthermore, additionally also have an analog to digital converter for digitizing the measurement voltage provided by means of the measuring resistor and additionally be adapted to provide a correspondingly digitized measurement voltage as an—in such case digitized—electrical current measurement signal.

In the case of the, coil arrangement of the invention, the control- and monitoring circuit 40 checks the coil 10 by determining, based on the electrical current measurement signal $i_M$, whether the inductance L of the coil has an—expected, respectively predetermined, namely corresponding to a movement of an intact armature from its one end position into its other in the position—dependence on the switching signal ctrl as a function of time, respectively a behavior as a function of time corresponding to the switching signal ctrl as a function of time. This, for example, namely in such a manner that the control- and monitoring circuit 40 determines whether the coil shows a variable inductance L corresponding to a variable signal level of the switching signal, namely resulting from a movement of the armature from its one end position into the other end position. Alternatively or supplementally, the checking of the coil 10 by the control- and monitoring circuit can also occur in that the control- and monitoring circuit determines, based on the electrical current measurement signal $i_M$, whether the coil reacts to a change of the signal level of the switching signal from the first signal level ("H") to the second signal level ("L") with a change of its inductance L, for example, namely with an increase as a result of a movement of the armature from its second end position into its first end position, and/or that the control- and monitoring circuit determines, based on the electrical current measurement signal $i_M$, whether the coil reacts to a change of the signal level of the switching signal from the second signal level to the first signal level with a corresponding change of its inductance L, for example, namely with a decrease as a result of a movement of the armature from its first end position into its second end position.

The control- and monitoring circuit is, for the above-described case, in which it has a microprocessor, furthermore, adapted to process the electrical current measurement signal by means of the microprocessor. For example, the electrical current measurement signal can be embodied as a direct voltage proportional to the electrical current and be placed on an analog signal input of the correspondingly adapted microprocessor, in order therewith to be digitized, namely converted into a digital signal representing the electrical current flowing in the coil electrical current circuit as a function of time and thereafter be evaluated. Alternatively or supplementally, the control- and monitoring circuit can, however, also have a separate analog to digital converter, consequently one not integrated in the, in given cases, provided microprocessor. The analog to digital converter can likewise be adapted to receive and correspondingly to digitize the electrical current measurement signal. Furthermore, it is, however, also an option so to embody and to adapt the operating circuit that it can already output the electrical current measurement signal as a digitized signal, thus in the form of a digital signal representing the electrical current flowing in the coil electrical current circuit as a function of time.

For the above-described case, in which the electrical current measurement signal is present in the form of a digital signal, respectively is to be processed by the control- and monitoring circuit in digitized form, the control- and monitoring circuit comprises, in an additional embodiment of the invention, a volatile data memory RAM. Furthermore, the control- and monitoring circuit is, in such case, adapted to store the (digitized) electrical current measurement signal, at least as an extract, in the data memory RAM, in such a manner that in the data memory RAM at least temporarily at least one sequence of digital electrical current values, namely digital values of a digitized electrical current measurement signal, is held and, thus, is kept at least for a predetermined duration for another evaluation by the control- and monitoring circuit. Furthermore, the control- and monitoring circuit, respectively its, in given cases, provided microprocessor, is adapted to perform the checking of the coil using the sequence of digital electrical current values. For example, the sequence kept in the data memory can be so selected that it is stored in the data memory in the form of a sequence representing a switching-off event of the coil, namely representing the electrical current flowing in the coil as a function of time after a toggling of the electronic switch from the first switch state into the second switch state, at times, also referred to as switching-off electrical current curve sequence of digital electrical current values, and/or at least temporarily in the form of a sequence representing a switching-on event of the coil, namely representing the electrical current flowing in the coil as a function of time after a toggling of the electronic switch from the second switch state into the first switch state, at times, also referred to as a switching-on electrical current curve sequence of digital electrical current values. Representative for such electrical current flowing in the coil as a function of time are the examples of sequences shown in FIG. 2a, respectively 2b, for switching-on events of the coil, wherein FIG. 2a shows a switching-on electrical current curve recorded with an intact coil (☺) and FIG. 2b a recorded switching-on electrical current curve with a coil (☹) defective in the above indicated sense.

Figure 2A:
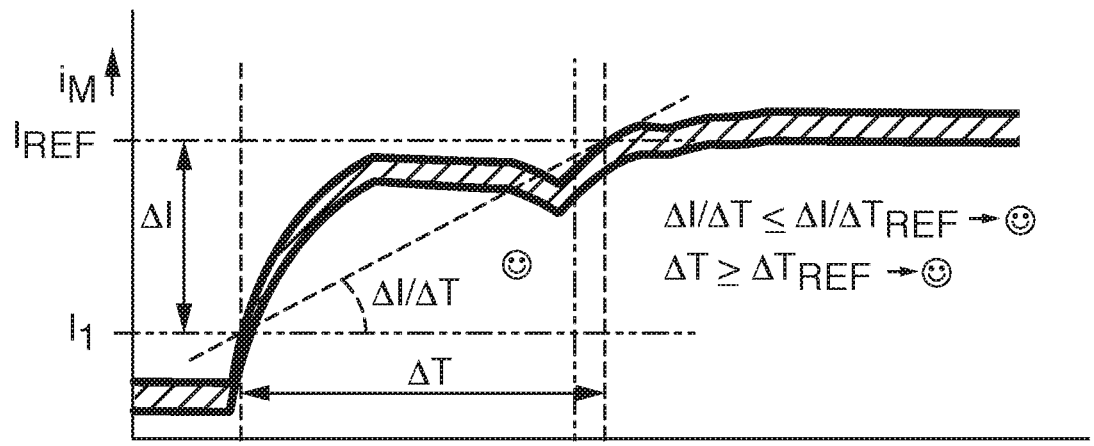
FIGS. 2a, 2b, and 2c are a set of graphs schematically illustrating time series-, respectively characteristic curves, for the operation of the coil arrangement shown in FIG. 1.
Figure 2B:
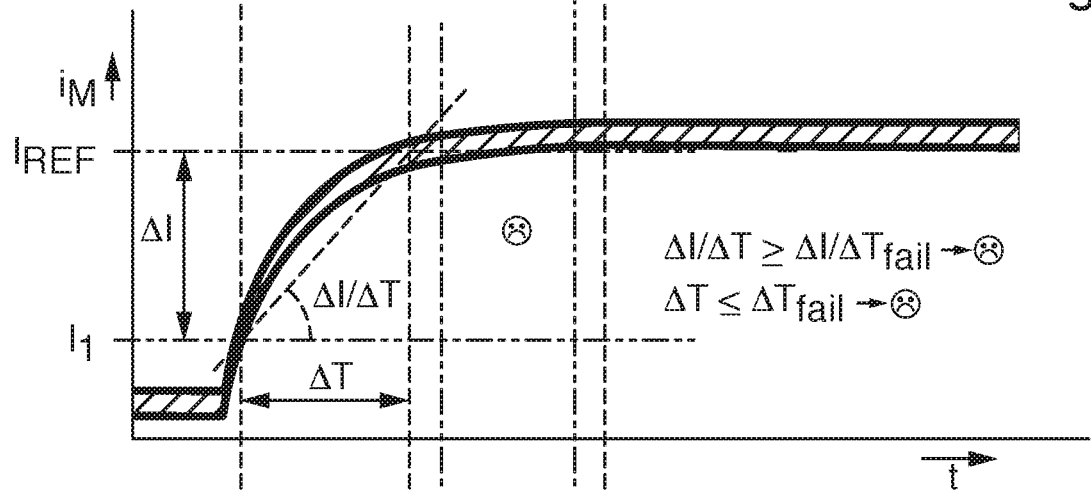
Figure 2C:
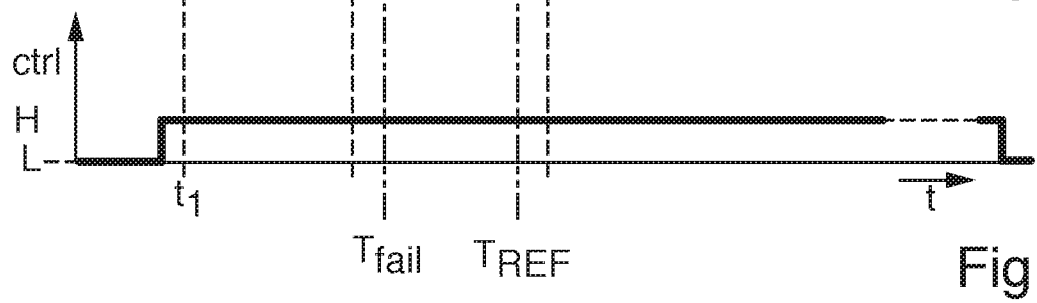

As directly evident from a comparison of the two electrical currents shown in FIG. 2a, respectively 2b, as a function of time in the respective coils, in each case, with the switching signal ctrl correspondingly displayed in FIG. 2c as a function of time, the electrical current as a function of time of an intact coil can significantly differ from that of a defective coil, among others things in that the electrical current flowing in a coil electrical current circuit with intact coil reacts, in each case, in comparison to an electrical current flowing in the coil electrical current circuit with defective coil, to changes of the switch state of the switch, respectively, associated therewith, change of the previously indicated electrical resistance of the coil electrical current circuit, more strongly delayed, respectively slower; this, especially, also in such a manner that, for example, in the case of intact coil, the electrical current, after an (abrupt) toggling of the switch from its second into its first switch state, respectively after a corresponding switching-on of the coil electrical current circuit, goes more slowly to a steady end value—here, practically, a holding current—then in the case of coil defective in the above indicated sense, respectively that the electrical current in the case of a defective coil can reach the end value, or a predetermined reference value $I_{REF}$ corresponding therewith, earlier than in the case of intact coil and equal operating voltage. In accordance therewith, thus the coil electrical current circuit can have a dynamic behavior dependent on the respective state (respectively, defect state) of the coil, which, in turn, is numerically representable based on the characterizing indices won from the electrical current therein flowing as a function of time, equally as well, this allows determination of an intact or a defective coil depending on level of a respective characteristic index value. Accordingly, the control- and monitoring circuit is, in an additional embodiment of the invention, furthermore, adapted, based on the electrical current measurement signal $i_M$, to ascertain, respectively to calculate, in given cases, also recurringly, a characteristic value for electrical current dynamics, namely a characteristic index value for a characteristic variable characterizing the electrical current $i_x$ flowing in the coil, respectively in the coil electrical current circuit formed therewith, as a function of time, consequently a dynamic behavior of the coil electrical current circuit. The characteristic variable can be, for example, one, which characterizes a dynamic transitional region of the electrical current, namely the electrical current as a function of time directly after a toggling of the electronic switch from the first switch state into the second switch state or after a toggling of the electronic switch from the second switch state into the first switch state. Examples of the characteristic variable include a rate of change $\Delta I/\Delta T$ of the electrical current $i_x$ or a required time span $\Delta T$ from a corresponding starting point in time $t_1$ up to reaching a predetermined electrical current value $I_{REF}$. The starting point in time $t_1$ can be, for example, a point in time, at which the control- and monitoring circuit can detect, based on the electrical current measurement signal, that the electrical current $i_x$ after a toggling of the switch 30 from its first into its second switch state and/or, vice versa, has reached a predetermined starting electrical current value $I_1$—here thus an electrical current value serving as trigger threshold for a time measurement. The rate of change $\Delta I/\Delta T$ to be ascertained for the electrical current $i_x$ can, as also indicated in FIG. 2a, respectively 2b, be, for example, also an average rate of change of the electrical current for the above time span $\Delta T$, which in the case of intact coil (☺) corresponds to a predetermined first rate of change $\Delta I/\Delta T_{REF}$ or is smaller than that, respectively which in the case of defective coil (☹) corresponds to a predetermined second rate of change $\Delta I/\Delta T_{fail}$ or is greater than that. Another opportunity for calculating such an electrical current dynamics, characterizing value, namely one suitable for checking of the coil 10, is, for example, to integrate a subsection of the electrical current measurement signal $i_M$ ascertained for a dynamic transitional region of the above indicated type—, for example, thus a time interval directly following a toggling of the switch 30 from its one into its other switch state or also another suitable time interval—, namely a subsection of the electrical current measurement signal $i_M$ representing the electrical current as a function of time within the respectively, correspondingly predetermined time interval, to exemplify, thus to ascertain, an area enclosed by the subsection of the electrical current measurement signal corresponding to the time interval. The predetermined time interval can correspond, for example, to a time span $\Delta T_{REF}-t_1$ lying between a predetermined starting point in time $t_1$ and a predetermined end point in time $T_{REF}$.

For the above-described case, in which a volatile data memory RAM is provided in the control- and monitoring circuit, the control- and monitoring circuit can for this, furthermore, be adapted to store, at least temporarily in the data memory RAM, digital electrical current values corresponding to at least one of the above indicated dynamic transition regions and thereafter to ascertain the characteristic value for electrical current dynamics by applying digital electrical current values kept in the volatile data memory RAM, for example, namely using a sequence of digital electrical current values at least temporarily held in the data memory RAM and representing a switching-off event of the coil, consequently a switching-off electrical current curve and/or using a switching-on event of the coil kept at least temporarily in the data memory RAM, consequently a sequence of digital electrical current values representing a switching-on electrical current curve, and/or using a sequence of digital electrical current values kept at least temporarily in the data memory RAM and representing another suitable dynamic transitional region. In an additional embodiment of the invention, the control- and monitoring circuit is, in such case, furthermore, adapted to calculate the characteristic value for electrical current dynamics by summing a predetermined number of digital electrical current values, beginning with a starting electrical current value $I_1$ representing an electrical current flowing in the coil electrical current circuit at a predetermined starting point in time $t_1$ and/or a starting point in time $t_1$ ascertained during operation, for example, also in order to perform the above integration of a subsection of the electrical current measurement signal $i_M$.

The above-described characteristic value for electrical current dynamics can in the course of a checking of the coil 10, respectively the coil arrangement formed therewith, be compared with one or more correspondingly predetermined reference values, namely reference values ascertained earlier for one or more defect scenarios and, in each case, furnished to the control- and monitoring circuit, for example, in order, based on such a comparison, at least to detect, whether the coil is still intact or has just become defective. Accordingly, the control- and monitoring circuit is, in an additional embodiment of the invention, furthermore, adapted, for the purpose of checking the coil, to ascertain, especially namely to calculate, a deviation between the, in each case, ascertained characteristic value for electrical current dynamics and a predetermined reference value, for example, thus a reference value earlier measured and/or stored in the monitoring circuit. Furthermore, the control- and monitoring circuit is, in an additional embodiment of the invention, supplementally adapted for checking of the coil, to compare the deviation with a predetermined threshold value THR, for example, in turn, one earlier stored in the control- and monitoring circuit. The threshold value THR can, in the simplest case, represent a reference value earlier ascertained for one of the prescribed defect scenarios of the coil or an interval boundary for a value range corresponding to a defective coil for a characteristic variable corresponding to the respective electrical current dynamics, characteristic value. The at least one reference value serving, in given cases, also as threshold value TRH, respectively the above indicated reference values, can be stored, for example, in a non-volatile data memory EEPROM provided in the control- and monitoring circuit. For the above-described case, in which the control- and monitoring circuit has additionally at least one microprocessor µC, held in the data memory EEPROM further can be also at least one control program for microprocessor µC, for example, also a control program controlling the generating of the switching signal ctrl and/or the checking of the coil.

In an additional embodiment of the invention, the control- and monitoring circuit is, furthermore, adapted at least, at times, for example, namely automatically upon interim terminating of a checking of the coil and/or on query, to output a result of the checking of the coil, for example, namely to provide a status signal msg, especially a binary or digital, status signal, dependent on a result of the checking of the coil, respectively reporting the result. Alternatively or supplementally, it is, furthermore, provided that the control- and monitoring circuit, as a result of the checking of the coil, generates a report—, for example, in the form of a corresponding defect code and/or as cleartext—signaling a defective coil, respectively a defective coil arrangement, for example, in case an exceeding of the above indicated threshold value TRH is ascertained corresponding to a defective coil. The report can, beside reporting the defect, for example, also serve to provide one or more possible causes for the defect, for example, in such a manner that the defect is, respectively can be, that the armature 20, both in the case of switching signal ctrl having the first signal level value ("H") as well as also in the case of switching signal ctrl having the second signal level value ("L"), is remaining in the first end position I or that the armature 20, both in the case of switching signal cltr having the first signal level value ("H") as well as also in the case of switching signal ctrl having the second signal level value ("L"), is remaining in the second end position II, or, for instance, in such a manner that the defect is, respectively can be, that armature 20 is broken off, blocked, respectively absent. The report can be output externally, for example, without delay, for example, via a display element connected to the control- and monitoring circuit, and/or be kept in a non-volatile data memory, in given cases, also registered together with a current date and/or a current clock time, for later evaluation.

Figure 3:
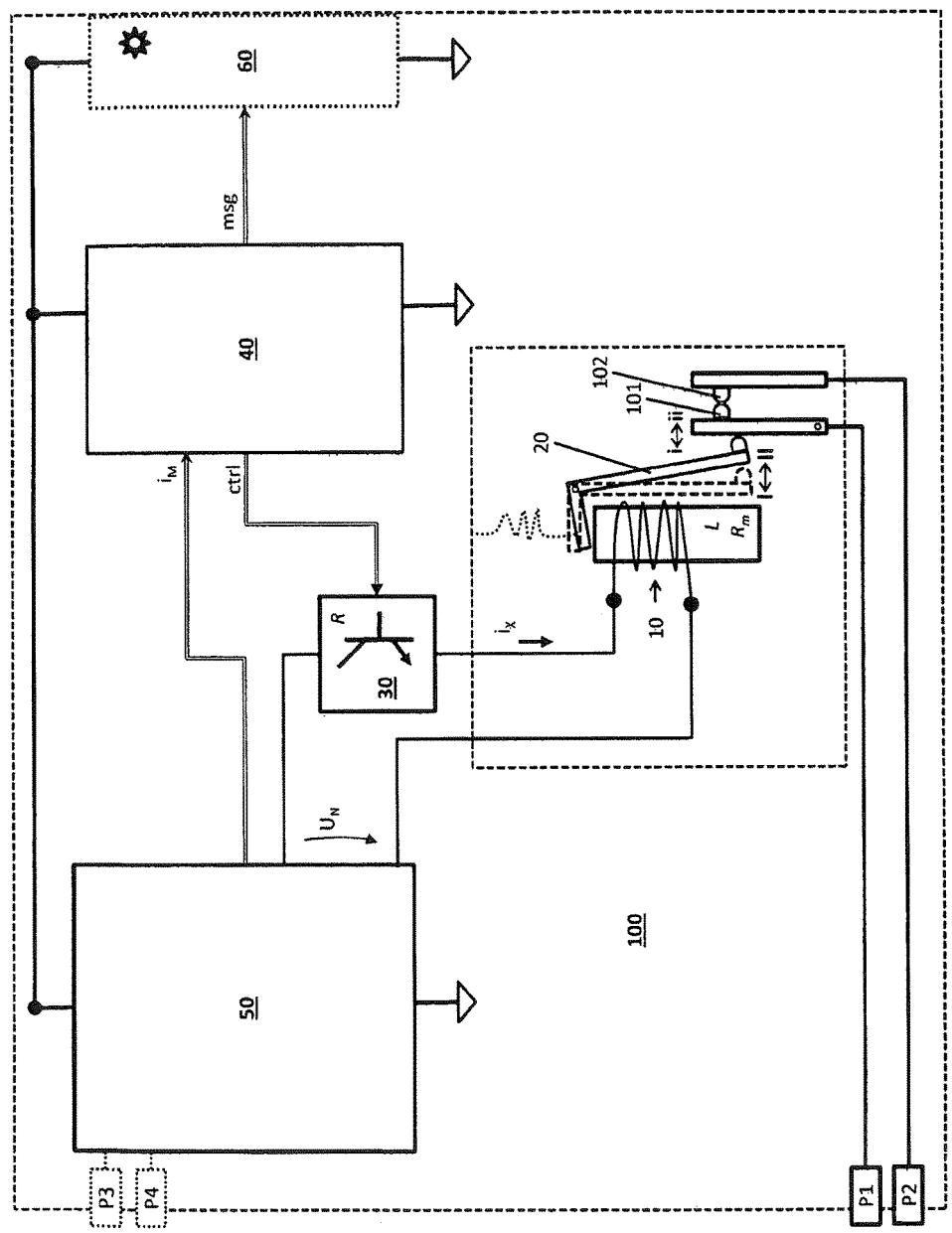
FIG. 3 is schematically, an electromechanical switch formed by means of a coil arrangement shown in FIG. 1, especially an electromechanical switch suitable for a measuring device of industrial measuring- and automation technology.

In an additional embodiment of the invention, the coil arrangement is embodied as a component of an electromechanical switch 100, which switch 100, such as schematically shown in FIG. 3, respectively directly evident from a combination of FIGS. 1 and 3, comprises, supplementally to the coil arrangement, a first switch contact 101, for example, also a resiliently, respectively elastically, seated, first switch contact 101 movable between a first switch position i and a second switch position ii, as well as a—thereto antagonistic—second switch contact 102, respectively it is provided in an additional embodiment of the invention to use the coil arrangement for forming an electromechanical switch, respectively relay. The coil arrangement serves, in such case,—such as usual in the case of such electromechanical switches, respectively relays—, especially to actuate the switch contact 101, wherein the armature 20 is adapted and located, in order, upon moving from its first end position I into its second end position II, to take the first switch contact 101 with it, respectively to release the first switch contact 101, in such a manner that the switch contact 101 moves, is moved, from its first switch position i into its second switch position ii. Furthermore, the armature 20 is adapted and located, in order, upon moving from its second end position II into its first end position I, to take the first switch contact 101 with it, respectively to release the first switch contact 101, in such a manner that the switch contact 101 moves, is moved, from its second switch position ii into its first switch position i. The first switch contact 101, in turn, in an additional embodiment of the invention, is adapted, in the first switch position i, to be spaced from the second switch contact, in order to form a high-ohm, respectively electrically insulating, air path, respectively, in the second switch position ii, to contact the switch contact 102, in order to form a low-ohm, respectively electrically conductive, connection, for example, in order to interrupt, respectively to close, an electrical circuit formed by means of the two switch contacts 101, 102 and here led via connection terminals P1, P2.

The control- and monitoring circuit of a so formed electromechanical switch 100 is, in an additional embodiment of the invention, furthermore, adapted to generate a warning report signaling a failure of the switch, in case, as a result of the checking of the coil performed by the control- and monitoring circuit using the electrical current measurement signal, a defect of the coil is detected—, for instance, as a result of an armature persisting in the first end position both in the case of switching signal having the first signal level value as well as also in the case of switching signal having the second signal level value, respectively as a result of an armature persisting in the second end position both in the case of switching signal having the first signal level value as also in the case of switching signal having the second signal level value.

Figure 4:
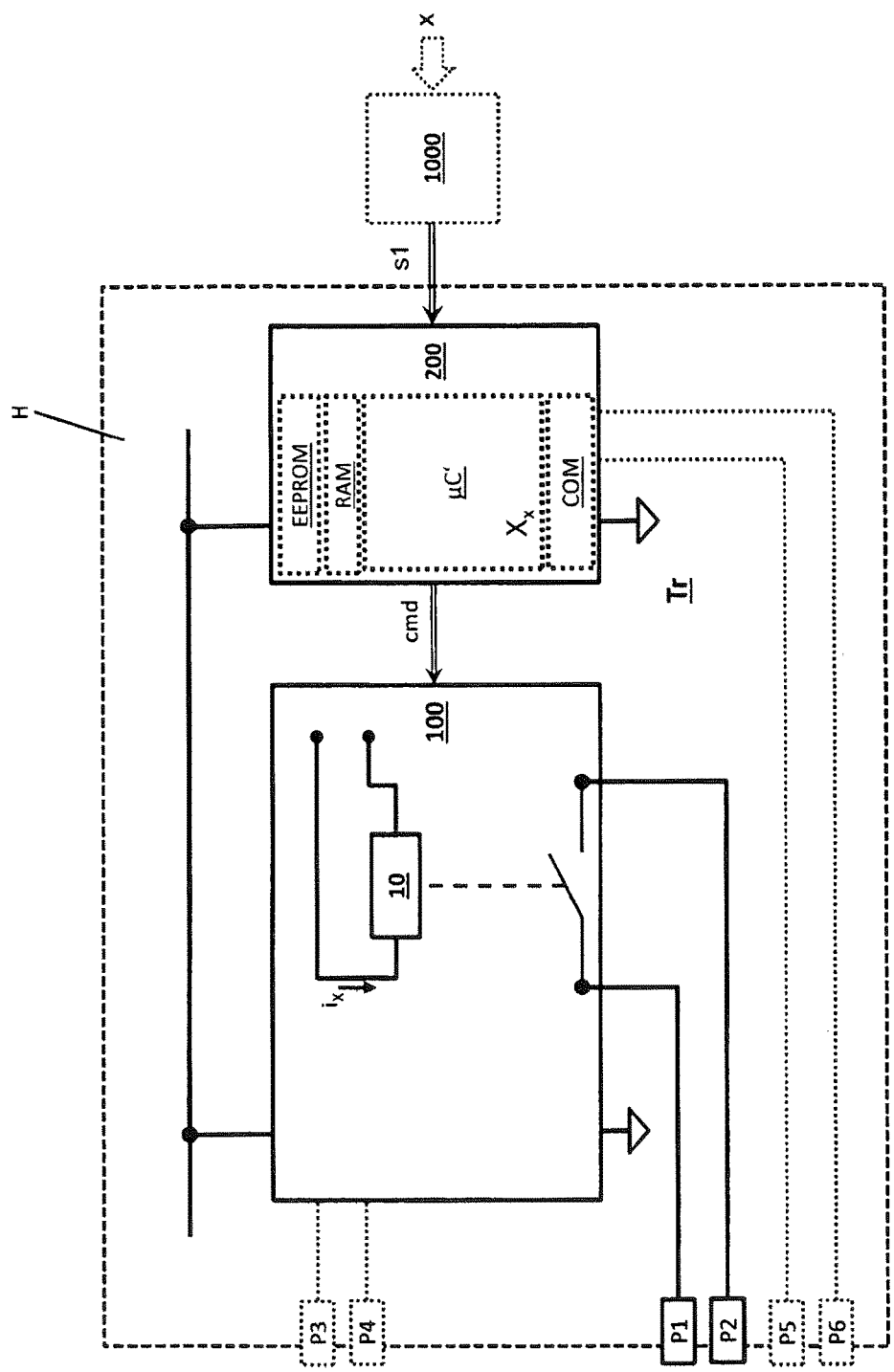
FIG. 4 is schematically, a measurement transmitter having an electromechanical switch, respectively a measuring device formed therewith.

In an additional embodiment of the invention, the coil arrangement 10, respectively the electromechanical switch 100 formed therewith, is embodied as a component of a measurement transmitter Tr (FIG. 4). The measurement transmitter comprises, such as shown schematically in FIG. 4, respectively directly evident from a combination of FIGS. 3 and 4, respectively FIGS. 1, 3 and 4, (supplementally to the coil arrangement 10, respectively to the electromechanical switch formed therewith) a measuring circuit 200, for example, one formed by means of a microprocessor μC and/or supplied power from the operating circuit 50, wherein the measuring circuit 200 serves for receiving at least one electrical and/or analog, transducer signal s1, for example, a transducer signal dependent on a physical or chemical, measured variable x—, for example, namely a mass flow rate, a volume flow rate, a density, a viscosity, a temperature or a pressure of a fluid guided in a pipeline and/or kept in a container—and/or a transducer signal representing the measured variable x as a function of time. The measuring circuit 200 of the measurement transmitter Tr is, in an additional embodiment of the invention, provided, respectively adapted, during operation, using the transducer signal s1, recurringly to ascertain measured values for the measured variable x, for example, also in the form of digital values generated cyclically, respectively in real time.

In another embodiment of the invention, the above discussed measurement transmitter Tr further comprises a transmitter housing H—, for example, a hermetically sealed and/or explosion resistant, transmitter housing—, within which, as also schematically shown in FIG. 4, both the measuring circuit 200 and also the coil arrangement, respectively the electromechanical switch 100 formed therewith, are placed.

Especially in such case, it is, furthermore, provided, by means of the switch 100, to form a switch- or relay output of the measurement transmitter Tr, consequently to use the switch 100 to switch, namely selectively, to switch on, respectively off, an electrical circuit extending partially externally of the measurement transmitter, for example, led via connection terminals P1, P2. The switching of the electrical current circuit can, for example, serve to produce, respectively to output, a binary signal, for instance, for reporting an operating state of the measuring device and/or for transmission of a defect report, respectively an alarm, to a remote reporting system. The electromechanical switch embodied as a component of the measurement transmitter Tr can, furthermore, for example, also be adapted to be actuated as a function of the measured variable x, respectively the ascertained measured values, for instance, in order to signal an exceeding, respectively subceeding, of a threshold value earlier fixed for the measured variable x, respectively without delay to introduce a corresponding (counter-) measure, for instance, by turning on, respectively turning off, a pump or by opening—, respectively closing, a valve, etc. . . . . . Accordingly, the measuring circuit, in an additional embodiment of the invention, is, furthermore, adapted to generate a control signal cmd instructing the control- and monitoring circuit, for example, namely causing a change of the signal level of the switching signal from the first signal level to the second signal level or a change of the signal level of the switching signal from the second signal level to the first signal level and/or a digital, control signal cmd, respectively to output such a control signal cmd to the control- and monitoring circuit. Especially, the measuring circuit is, furthermore, adapted to generate the control signal cmd using the transducer signal and/or as a function of at least one of the measured values, for example, namely based on a recurringly performed comparison of the transducer signal, respectively the measured values, with a correspondingly predetermined threshold value.

The measurement transmitter Tr is, in an additional embodiment of the invention, furthermore, adapted to be supplied with electrical energy by an external energy supply (not shown) connectable to supply terminals P3, P4, respectively to draw during operation the required electrical power at least partially, respectively at least at times, from the external energy supply.

For the purpose of reporting a result of a possible checking of the coil, for example, to a user initiating the review, respectively to service personnel in charge of such, the measurement transmitter comprises, in an additional embodiment of the invention, furthermore, a display element 60 operated by the control- and monitoring circuit 40 and formed, for example, by means of a liquid crystal display (LCD) and/or a light emitting diode (LED). Especially, the control- and monitoring circuit 40 is, in such case, furthermore adapted to transmit a result of the checking of the coil, for example, in the form of a binary or digital, status signal, to the display element 60, respectively the display element is adapted to indicate the result visually perceivably. Moreover, the display element 60 can also be used to display an instantaneous switch state of the electronic switch 30, respectively an instantaneous signal level value of the switching signal ctrl. Furthermore, the display element 60 can, for example, also be provided, respectively the measurement transmitter can be adapted, to indicate measured values generated by means of the measuring circuit 200.

In advantageous manner, the, for example, also remotely parameterable, measurement transmitter Tr, can, furthermore, be so designed, that it can, during operation, exchange measuring—and/or operating data, in given cases, also in real time, with a superordinated electronic data processing system, for example, a programmable logic controller (PLC), a personal computer and/or a work station, via the data transmission system, for example, by wire (P5, P6) via serial fieldbus (PROFIBUS, FOUNDATION FIELDBUS, etc.), respectively Ethernet and/or wirelessly per radio, data such as, for instance, setting values serving for control of the measurement transmitter, respectively a measuring device formed therewith, respectively current measuring—and/or system diagnostic values. Especially, the measurement transmitter Tr can, furthermore, also be adapted to transmit a result of the checking of the coil to the data processing system, for example, in the form of a binary or digital, status signal or also in the form of a telegram readable by means of the data processing system and, in given cases, also transmitted with a cyclic data transfer method, respectively in real time.

The measuring circuit of the above indicated measurement transmitter Tr is, in an additional embodiment of the invention, and such as schematically shown in FIG. 4, electrically coupled to a measuring transducer 1000, for example, a measuring transducer in the form of a physical-electrical transducer, in order to form a measuring device, for example, also one suitable for industrial measuring- and automation technology. Measuring transducer 1000 serves, in such case, especially, to register a time variable, physical and/or chemical, measured variable x—, for example, namely a mass flow rate, a volume flow rate, a density, a viscosity, a temperature, or a pressure of a fluid guided in a pipeline and/or kept in a container—, especially to register a measured variable only within a predetermined measurement range, and, for the purpose of generating a transducer signal s1 representing the measured variable x, especially electrically and/or digitally, to transduce such physically to electrically, in given cases, also to sample, respectively to digitize, such already time- and value discretely.

The invention claimed is:

1. A coil arrangement, comprising:
an electrical coil including a coil core, and
an electrical current conductor ;
an armature movable between a first end position and a second end position;
an electronic switch switchable between at least two switch states;
a control and monitoring circuit for producing a switching signal with a variable signal level for actuating said electronic switch; and
an operating circuit for providing an operating voltage;
wherein:
a magnetic circuit is formed by means of said coil core and said armature, in such a manner that the magnetic circuit exhibits a magnetic resistance, dependent on a position of said armature,
said coil exhibits an inductance, dependent on the position of said armature;
said coil is adapted to lead an electrical current in said electrical current conductor and to convert the electrical current into a magnetic force acting between its coil core and said armature and dependent on an electrical current level of the electrical current;
said electronic switch is adapted to close, in a first switch state, a coil electrical current circuit formed by means of said operating circuit, said coil and said electronic switch, in such a manner that an electrical resistance of said coil electrical current circuit opposing an electrical current then driven by the operating voltage and flowing in said coil electrical current circuit then exhibits a first resistance value and to open, in a second switch state, said coil electrical current circuit, in such a manner that its electrical resistance exhibits then a second resistance value greater than said first resistance value;
and wherein:
said operating circuit is adapted to provide an electrical current measurement signal representing the electrical current flowing in said coil electrical current circuit as a function of time;
said control and monitoring circuit is adapted to provide the switching signal at times with a first signal level value causing said first switch state of said electronic switch;
said control and monitoring circuit is adapted to provide the switching signal at times with a second signal level value different from said first signal level value and causing said second switch state of said electronic switch;
and said control and monitoring circuit is adapted with application of the electrical current measurement signal to perform a checking of said coil, namely:
to detect, whether the inductance, of said coil shows a dependence on the switching signal as a function of time, respectively a behavior as a function of time corresponding to the switching signal as a function of time,
and/or to detect, whether said coil reacts to a change of said signal level of the switching signal from the first signal level to the second signal level with a change of its inductance,
and/or to detect, whether said coil reacts to a change of the signal level of said switching signal from said second signal level to the first signal level with a change of its inductance.

2. The coil arrangement as claimed in claim 1, wherein:
said control and monitoring circuit is adapted, with application of the electrical current measurement signal, to detect a defect of said coil, respectively of the coil arrangement.

3. The coil arrangement as claimed in claim 1, wherein:
said control and monitoring circuit is adapted to perform the checking of said coil using a digitized electrical current measurement signal, namely a digital signal representing the electrical current flowing in the coil electrical circuit as a function of time.

4. The coil arrangement as claimed in claim 1, wherein:
said control and monitoring circuit comprises a microprocessor.

5. The coil arrangement as claimed in claim 4, wherein:
said control and monitoring circuit is adapted to generate the switching signal by means of the microprocessor; and/or
said control and monitoring circuit is adapted to perform the checking of said coil by means of said microprocessor; and/or
said control and monitoring circuit is adapted to process the electrical current measurement signal by means of said microprocessor.

6. The coil arrangement as claimed in claim 1, wherein:
said control and monitoring circuit comprises a volatile data memory and is adapted to store said electrical current measurement signal, at least as an extract, in the data memory, in such a manner that said data memory retains at least temporarily at least one sequence of digital electrical current values, namely digital values of a digitized electrical current measurement signal.

7. The coil arrangement as claimed in claim 1, wherein:
said control and monitoring circuit is adapted to ascertain, based on said electrical current measurement signal, a characteristic value for electrical current dynamics, namely a characteristic index value for a characteristic variable characterizing the electrical current flowing in said coil as a function of time.

8. The coil arrangement as claimed in claim 7, wherein:
said control and monitoring circuit is adapted to ascertain the characteristic value for electrical current dynamics by applying digital electrical current values kept in a volatile data memory.

9. The coil arrangement as claimed in claim 8, wherein:
said control and monitoring circuit is adapted to ascertain the characteristic value for electrical current dynamics by summing a predetermined number of digital electrical current values, beginning with a starting electrical current value representing an electrical current flowing in said coil electrical current circuit at a predetermined starting point in time and/or a starting point in time ascertained during operation.

10. The coil arrangement as claimed in claim 7, wherein:
said control and monitoring circuit is adapted to ascertain said characteristic value for electrical current dynamics by integrating a subsection of the electrical current measurement signal representing the electrical current as a function of time within a predetermined time interval.

11. The coil arrangement as claimed in claim 7, wherein:
for checking said coil, said control and monitoring circuit is adapted to ascertain a deviation between the characteristic value for electrical current dynamics and a predetermined reference value.

12. The coil arrangement as claimed in claim 11, wherein:
for checking said coil, said control and monitoring circuit is adapted to compare the deviation with a predetermined threshold value.

13. The coil arrangement as claimed in claim 1, wherein:
said control and monitoring circuit includes a non-volatile data memory.

14. The coil arrangement as claimed in claim 13, wherein:
for checking said coil, said control and monitoring circuit is adapted to compare the deviation with a predetermined threshold value stored in said non-volatile data memory.

15. The coil arrangement as claimed in claim 1, wherein:
said control and monitoring circuit is adapted to output a result of the checking of said coil.

16. The coil arrangement as claimed in claim 1, wherein:
said control and monitoring circuit is adapted as a result of the checking of said coil, in case an exceeding of a predetermined threshold value is ascertained corresponding with a defective coil to generate a report signaling a defective coil.

17. The coil arrangement as claimed in claim 1, wherein:
said control and monitoring circuit is adapted to provide a status signal dependent on a result of the checking of said coil, respectively reporting such result.

18. The coil arrangement as claimed in claim 1, wherein:
said control and monitoring circuit includes an analog to digital converter, which is adapted to receive and to digitize the electrical current measurement signal.

19. The coil arrangement as claimed in claim 1, wherein:
said operating circuit is adapted to output the electrical current measurement signal digitally, namely in the form of a digital signal representing the electrical current flowing in said coil electrical current circuit as a function of time.

20. The coil arrangement as claimed in claim 1, wherein:
said operating circuit includes a measuring resistor for providing a measurement voltage proportional to the electrical current flowing in said coil electrical current circuit.

21. The coil arrangement as claimed in claim 20, wherein:
said operating circuit includes an analog to digital converter for digitizing the measurement voltage provided by means of said measuring resistor.

22. The coil arrangement as claimed in claim 21, wherein:
said operating circuit is adapted to output the digitized measurement voltage as the electrical current measurement signal.

23. The coil arrangement as claimed in claim 20, wherein:
said operating circuit is adapted to generate the electrical current measurement signal by means of the measurement voltage; and/or
said operating circuit is adapted to output the measurement voltage as electrical current measurement signal.

24. The coil arrangement as claimed in claim 1, further comprising:
mechanically coupled with the armature, a return spring, which is adapted to introduce into said armature a return force counteracting the magnetic force.

25. The coil arrangement as claimed in claim 1, wherein:
said control and monitoring circuit is adapted, with application of the electrical current measurement signal, to detect a defect of said coil, respectively of the coil arrangement, which defect is a result of a persisting of the armature in the first end position both in the case of switching signal having the first signal level value as well as also in the case of switching signal having the second signal level value.

26. The coil arrangement as claimed in claim 1, wherein:
said control and monitoring circuit is adapted, with application of the electrical current measurement signal, to detect a defect of said coil, respectively of the coil arrangement, which defect is a result of persisting of the armature in the second end position both in the case of switching signal having the first signal level value as well as also in the case of switching signal having the second signal level value.

27. The coil arrangement as claimed in claim 6, wherein:
the control and monitoring circuit is adapted to store the electrical current measurement signal, at least as an extract, in the data memory, in such a manner that at least temporarily a sequence of digital electrical current values representing a switching-off event of said coil, namely the electrical current flowing in said coil as a function of time after a toggling of the electronic switch from said first switch state into said second switch state, is stored in said data memory and/or that at least temporarily a sequence of digital electrical current values representing a switching-on event of said coil, namely the electrical current flowing in said coil as a function of time after a toggling of the electronic switch from said second switch state into said first switch state, is stored in said data memory.

28. The coil arrangement as claimed in claim 7, wherein:
said control and monitoring circuit is adapted to ascertain the characteristic value for electrical current dynamics after a toggling of the electronic switch from said first switch state into said second switch state or after a toggling of the electronic switch from said second switch state into said first switch state.

29. The coil arrangement as claimed in claim 1, wherein:
said control and monitoring circuit is adapted to ascertain, based on said electrical current measurement signal a characteristic value for electrical current dynamics, namely a characteristic value in the form of a rate of change of the electrical current or a time span required from a starting point in time until reaching a predetermined electrical current value.

30. The coil arrangement as claimed in claim 8, wherein:
said control and monitoring circuit is adapted to ascertain the characteristic value for electrical current dynamics by using a sequence of digital electrical current values at least temporarily kept in the volatile data memory and representing a switching-off event of said coil.

31. The coil arrangement as claimed in claim 8, wherein: said control and monitoring circuit is adapted to ascertain the characteristic value for electrical current dynamics by using a sequence of digital electrical current values at least temporarily kept in said volatile data memory and representing a switching-on event of said coil.

32. The coil arrangement as claimed in claim 8, wherein a predetermined reference value is stored in the monitoring circuit.

33. The coil arrangement as claimed in claim 11, wherein: a predetermined threshold value represents an interval boundary for a defective coil value range of the characteristic variable characterizing the electrical current flowing in said coil as a function of time.

34. An electromechanical switch, comprising: a resilient first switch contact, movable between a first switch position and a second switch position;
a second switch contact; a coil arrangement for actuating the first switch contact, wherein: the coil arrangement comprises an electrical coil including a coil core and an electrical current conductor surrounding said coil core
an electronic switch switchable between at least two switch states,
a control and monitoring circuit for producing a switching signal with a variable signal level for actuating said electronic switch;
and an operating circuit for providing an operating voltage
wherein:
a magnetic circuit is formed by means of said coil core and said armature, in such a manner that the magnetic circuit exhibits a magnetic resistance, dependent on a position of said armature said coil exhibits an inductance, dependent on the position of said armature;
said coil exhibits an inductance, dependent on the position of said armature;
said coil is adapted to lead an electrical current in said electrical current conductor and to convert the electrical current into a magnetic force acting between its coil core and said armature and dependent on an electrical current level of the electrical current;
said electronic switch is adapted to close, in a first switch state, a coil electrical current circuit formed by means of said operating circuit, said coil and said electronic switch, in such a manner that an electrical resistance of said coil electrical current circuit opposing an electrical current then driven by the operating voltage and flowing in said coil electrical current circuit then exhibits a first resistance value and to open, in a second switch state, said coil electrical current circuit, in such a manner that its electrical resistance exhibits then a second resistance value greater than said first resistance value;
wherein said operating circuit is adapted to provide an electrical current measurement signal representing the electrical current flowing in said coil electrical current circuit as a function of time;
said control and monitoring circuit is adapted to provide the switching signal at times with a first signal level value causing said first switch state of said electronic switch; said control and monitoring circuit is adapted to provide the switching signal at times with a second signal level value different from said first signal level value and causing said second switch state of said electronic switch; and said control and monitoring circuit is adapted with application of the electrical current measurement signal to perform a checking of said coil, namely:
to detect, whether the inductance, of said coil shows a dependence on the switching signal as a function of time, respectively a behavior as a function of time corresponding to the switching signal as a function of time,
and/or to detect, whether said coil reacts to a change of said signal level of the switching signal from the first signal level to the second signal level with a change of its inductance,
and/or to detect, whether said coil reacts to a change of the signal level of said switching signal from said second signal level to the first signal level with a change of its inductance.
and said armature of said coil arrangement is adapted in the case of moving from its first end position into its second end position to move said first switch contact from its first switch position into its second switch position.

35. The electromechanical switch as claimed in claim 34, wherein:
said first switch contact is adapted in said first switch position to be spaced from said second switch contact, in order to form a high-ohm, respectively electrically insulating, air path; and
said first switch contact is adapted in said second switch position to contact said second switch contact, in order to form a low-ohm, respectively electrically conductive, connection.

36. The electromechanical switch as claimed in claim 35, wherein:
said control and monitoring circuit is adapted, in case, as a result of checking said coil performed using the electrical current measurement signal, a defect of said coil is detected, to generate a warning report signaling a failure of the electromechanical switch.

37. A measurement transmitter, comprising:
an electromechanical switch, comprising a resilient first switch contact, movable between a first switch position and a second switch position;
a second switch contact; and
a coil arrangement for actuating the first switch contact, wherein: the coil arrangement comprises an electrical coil including a coil core and an electrical current conductor surrounding said coil core;
an armature movable between a first end position and a second end position;
an electronic switch switchable between at least two switch states;
a control and monitoring circuit for producing a switching signal with a variable signal level for actuating said electronic switch; and
an operating circuit for providing an operating voltage;
and a measuring circuit for receiving at least one electrical transducer signal, dependent on a physical or chemical measured variable and/or representing the measured variable as a function of time;
wherein: a magnetic circuit is formed by means of said coil core and said armature, in such a manner that the magnetic circuit exhibits a magnetic resistance, dependent on a position of said armature;
said coil exhibits an inductance, dependent on the position of said armature;
said coil is adapted to lead an electrical current in said electrical current conductor and to convert the electrical current into a magnetic force acting between its coil core and said armature and dependent on an electrical current level of the electrical current;

said electronic switch is adapted to close, in a first switch state, a coil electrical current circuit formed by means of said operating circuit, said coil and said electronic switch, in such a manner that an electrical resistance, of said coil electrical current circuit opposing an electrical current driven by the operating voltage and flowing in said coil electrical current circuit then exhibits a first resistance value and to open, in a second switch state, said coil electrical current circuit, in such a manner that its electrical resistance exhibits then a second resistance value greater than said first resistance value; wherein:

said operating circuit is adapted to provide an electrical current measurement signal representing the electrical current flowing in said coil electrical current circuit as a function of time;

said control and monitoring circuit is adapted to provide the switching signal at times with a first signal level value causing said first switch state of said electronic switch;

said control and monitoring circuit is adapted to provide the switching signal at times with a second signal level value different from said first signal level value and causing said second switch state of said electronic switch;

and said control and monitoring circuit is adapted with application of the electrical current measurement signal to perform a checking of said coil, namely:

to detect, whether the inductance, of said coil shows a dependence on the switching signal as a function of time, respectively a behavior as a function of time corresponding to the switching signal as a function of time, and/or to detect, whether said coil reacts to a change of said signal level of the switching signal from the first signal level to the second signal level with a change of its inductance, and/or to detect, whether said coil reacts to a change of the signal level of said switching signal from said second signal level to the first signal level with a change of its inductance, and said armature of said coil arrangement is adapted in the case of moving from its first end position into its second end position to move said first switch contact from its first switch position into its second switch position.

38. The measurement transmitter as claimed in claim 37, further comprising:
a transmitter housing, wherein:
both said measuring circuit as well as also said electromechanical switch are located within said transmitter housing.

39. The measurement transmitter as claimed in claim 38, further comprising:
a display element operated by said control and monitoring circuit.

40. The measurement transmitter as claimed in claim 39, wherein:
said control and monitoring circuit is adapted to transmit to said display element a result of the checking of said coil; and
said display element is adapted to indicate the result visually perceivably.

41. The measurement transmitter as claimed in claim 38, wherein:
said measuring circuit is adapted to generate a control signal instructing said control and monitoring circuit.

42. The measurement transmitter as claimed in claim 41, wherein:
said measuring circuit is adapted to generate the control signal using the transducer signal and/or as a function of at least one of the measured values.

43. The measurement transmitter as claimed in claim 37, wherein:
said measuring circuit is adapted to ascertain, using the transducer signal, measured values for the measured variable.

44. The measurement transmitter as claimed in claim 37, wherein:
a switch output of the measurement transmitter is formed by means of the electromechanical switch.

45. The measurement transmitter as claimed in claim 44, wherein:
the switch output is adapted to switch an electrical circuit extending partially externally of the measurement transmitter.

46. A measuring device, comprising
a measuring circuit for receiving at least one electrical transducer signal, dependent on a physical or chemical measured variable and/or representing the measured variable as a function of time;
an electromechanical switch, comprising a resilient first switch contact, movable between a first switch position and a second switch position, a second switch contact and a coil arrangement for actuating the first switch contact, wherein: the coil arrangement comprises an electrical coil including a coil core and an electrical current conductor surrounding said coil core;
an armature movable between a first end position and a second end position;
an electronic switch switchable between at least two switch states;
a control and monitoring circuit for producing a switching signal with a variable signal level for actuating said electronic switch;
an operating circuit for providing an operating voltage
and a measuring transducer electrically coupled with the measuring circuit for registering a time variable physical and/or chemical measured variable and for generating the at least one transducer signal;
wherein:
a magnetic circuit is formed by means of said coil core and said armature, in such a manner that the magnetic circuit exhibits a magnetic resistance, dependent on a position of said armature;
said coil exhibits an inductance, dependent on the position of said armature;
said coil is adapted to lead an electrical current in said electrical current conductor and to convert the electrical current into a magnetic force acting between its coil core and said armature and dependent on an electrical current level of the electrical current;
said electronic switch is adapted to close, in a first switch state, a coil electrical current circuit formed by means of said operating circuit, said coil and said electronic switch, in such a manner that an electrical resistance of said coil electrical current circuit opposing an electrical current driven by the operating voltage and flowing in said coil electrical current circuit then exhibits a first resistance value and to open, in a second switch state, said coil electrical current circuit, in such a manner that its electrical resistance exhibits then a second resistance value greater than said first resistance value;

wherein:

said operating circuit is adapted to provide an electrical current measurement signal representing the electrical current flowing in said coil electrical current circuit as a function of time;

said control and monitoring circuit is adapted to provide the switching signal at times with a first signal level value causing said first switch state of said electronic switch;

said control and monitoring circuit is adapted to provide the switching signal at times with a second signal level value different from said first signal level value and causing said second switch state of said electronic switch;

and said control and monitoring circuit is adapted with application of the electrical current measurement signal to perform a checking of said coil, namely:

to detect, whether the inductance, of said coil shows a dependence on the switching signal as a function of time, respectively a behavior as a function of time corresponding to the switching signal as a function of time, and/or to detect, whether said coil reacts to a change of said signal level of the switching signal from the first signal level to the second signal level with a change of its inductance, and/or to detect, whether said coil reacts to a change of the signal level of said switching signal from said second signal level to the first signal level with a change of its inductance;

and said armature of said coil arrangement is adapted in the case of moving from its first end position into its second end position to move said first switch contact from its first switch position into its second switch position.

* * * * *